United States Patent [19]

Li Bassi et al.

[11] Patent Number: 5,026,740

[45] Date of Patent: Jun. 25, 1991

[54] SULPHURATED DERIVATIVES OF AROMATIC-ALIPHATIC AND ALIPHATIC KETONES AS POLYMERIZATION PHOTOINITIATORS

[75] Inventors: Giuseppe Li Bassi, Gavirate; Luciano Cadonà; Carlo Nicora, both of Varese, all of Italy

[73] Assignee: Fratelli Lamberti SPA, Albizzate, Italy

[21] Appl. No.: 219,801

[22] Filed: Jul. 15, 1988

Related U.S. Application Data

[63] Continuation of Ser. No. 880,930, Jul. 1, 1986, abandoned.

[51] Int. Cl.$^5$ .................. C08F 2/50; C08G 59/17; C08K 5/07; C08L 63/10
[52] U.S. Cl. ........................... 522/14; 522/16; 522/33; 522/34; 522/35; 522/39; 522/36; 522/17; 522/103; 522/96; 522/81; 522/126; 522/84
[58] Field of Search ............ 522/33, 14, 17, 16, 522/35, 34, 39

[56] References Cited

U.S. PATENT DOCUMENTS

| | | |
|---|---|---|
| 3,386,904 | 6/1968 | Petropoulos .................. 522/33 |
| 3,615,467 | 10/1971 | Delzenne .................. 522/59 |
| 3,692,812 | 9/1972 | Berger .................. 556/429 |
| 3,720,635 | 3/1973 | Metzner .................. 522/33 |
| 3,732,273 | 5/1973 | Heine et al. .................. 522/42 |
| 3,937,722 | 2/1976 | Heine .................. 522/44 |
| 3,996,257 | 12/1976 | Larsen .................. 558/240 |
| 3,998,866 | 12/1976 | Oswald .................. 560/357 |
| 4,141,806 | 2/1979 | Keggenhoff .................. 522/42 |
| 4,266,055 | 5/1981 | Inoue .................. 544/221 |
| 4,318,791 | 3/1982 | Felder .................. 522/33 |
| 4,324,628 | 4/1982 | Avar .................. 522/46 |
| 4,371,605 | 2/1983 | Renner .................. 430/280 |
| 4,434,035 | 2/1984 | Eichler .................. 522/42 |
| 4,504,372 | 3/1985 | Kirchmayr .................. 522/42 |
| 4,510,290 | 4/1985 | Kirchmayr .................. 522/33 |
| 4,654,294 | 3/1987 | Sato .................. 522/116 |

FOREIGN PATENT DOCUMENTS 1919678 11/1970 Fed. Rep. of Germany .

Primary Examiner—Marion E. McCamish
Assistant Examiner—Arthur H. Koeckert
Attorney, Agent, or Firm—Stevens, Davis, Miller & Mosher

[57] ABSTRACT

The invention relates to the use of a new class of sulphurated derivatives of aromatic-aliphatic or aliphatic ketones as a) polymerization or crosslinking photoinitiators for transparent or pigmented mixtures containing ethylenically unsaturated photopolymerizable compounds, in particular for obtaining polyacrylates, b) photochemically releasable latent acid catalysts, useful for crosslinking systems polycondensable by acid catalysis, of the type comprising etherified aminoplasts together with compounds containing hydroxyl, carboxyl, amido, amino and other functionalities.

Said sulphurated derivatives enable manufactured articles to be obtained with exceptionally clear color while maintaining photochemical reactivity at high levels.

12 Claims, No Drawings

SULPHURATED DERIVATIVES OF AROMATIC-ALIPHATIC AND ALIPHATIC KETONES AS POLYMERIZATION PHOTOINITIATORS

This application is a continuation of application Ser. No. 880,930, filed Jul. 1, 1986, now abandoned.

This invention relates to the use of a new class of photoinitiators for the photoinduced polymerisation or crosslinking of mixtures containing (a) ethylenically unsaturated compounds, in particular for obtaining polyacrylates, (b) systems polycondensable by acid catalysis, such as etherifield aminoplasts together with compounds containing hydroxyl, carboxyl, amido and other functionalities.

It is well known that one of the most serious problems in the photoinitiated crosslinking of many systems used as transparent coating materials is the yellowing which occurs on exposing the films to the U.V. radiation of the crosslinking lamps [H. G. Heine and H. J. Traenker, Prog. Org. Coat., 3, 115-139 (1975); R. Kirchmayr, G. Berner, R. Husler, G. Rist., Farbe und Lack, 58, (11), 910-16 (1982)], and subsequently by natural ageing of the article under photooxidative conditions [J. Ohngemach, K. H. Neisius, J. Eichler and C. P. Herz, Kontakte (Merck) (3), 15-20 (1980)].

The problem is particularly important in materials containing acrylic and methacrylic unsaturations as these are preferred for use in the paper industry, and in those plastic materials in which the degree of yellowing often has to be kept very small.

In the case of pigmented dye systems, such as printing inks, another type of problem arises. In these cases the light is unable to totally penetrate into the film because of its absorption or reflection due to the pigments present. However, the best conditions for deep light penetration are obtained in certain spectral regions known as "optical windows" in which absorption and reflection jointly present an opposed variation. This happens generally in spectral regions situated towards the visible, and in particular in the case of rutile titanium dioxide, which is one of the most used pigments, between 370 and 420 nm. In these systems, photoinitiators having absorption maxima around 370-400 nm have to be used in order to allow maximum interaction of the photoactive system with the light.

Unfortunately many of these products are of yellow colour, such as benzil or the thioxanthones, and in addition their co-utilisation with tertiary amines as photoactivators leads to a more pronounced degree of yellowing of the articles obtained or to a variation in their colour tone [B. E. Hulme and J. J. Marron, Paint Resin, 54, (2), 31 (1984); M. Jacobi and H. Henne, Radcure Conference (Lausanne, 1983), FC 83-256].

It is also well known that aminoplastic resins are used as cross-linking agents for alkyd, polyester or acrylic systems in the coating industry. The crosslinking reaction is promoted by acids of various kinds, depending on the nature of the reactive groups: in particular, for esterified aminoplasts (such as hexamethoxymethyl melamine) sulphonic acids are used such as p-toluenesulphonic acid.

To prevent the catalysed systems having a too short shelf life or to avoid using two-component systems, the sulphonic acids are used in a blocked form (amino salts, oxime esters of hydroxamic acids, vicinal diol monoesters); the catalyst is then activated by heating to high temperature (100°-120° C.). This however leads to a reduction in the system efficiency.

These problems have been partly solved by the introduction of compounds which release sulphonic acid by radiation with UV light. Examples of these compounds are sulphonic ester derivatives of benzoin (DEOS No. 1919678 and DEOS No. 2842002), of N-hydroxyamides (U.S. Pat. No. 4,371,605), of beta-hydroxyketones (EP No. 89922), and of alphahydroxyketones (EP No. 84515). However many of these compounds present various problems in practical application, the most serious of which is their hydrolytic stability in particular under alkaline conditions, in the presence of nucleophilic species which limit their range of application.

We have now surprisingly discovered the subject of the present invention, namely that it is possible to obtain (a) the photoinduced polymerisation or crosslinking of mixtures containing ethylenically unsaturated compounds, and in particular containing acrylic compounds, (b) the polycondensation of systems which harden by acid catalysis, for example of the etherified aminoplast type in combination with compounds of hydroxyl, carboxyl, amido and other functionalities. (c) mixed systems of type (a) and (b) together, to produce films with a very low degree of yellowing. even in the case of co-utilisation of tertiary amines, by the use of compounds of general formula (I) as photoinitiators:

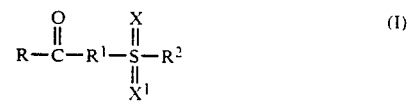

in which

R signifies: linear or branched $C_1$-$C_{18}$ alkyl, $C_3$-$C_7$ cycloalkyl possibly containing ethylenic unsaturations, $C_1$-$C_{18}$ oxa-, thia-, S—oxothia-, S—dioxothia-, or $R^3$—aza-alkyl, $C_3$-$C_7$ oxa-, thia-, S—oxothia-, S—dioxothia- or $R^3$—aza-cycloalkyl, $C_6$-$C_{14}$aryl, polyaryl, poly(arylalkenyl) or polyacryloyloxyarylene, aromatic heterocyclic ring of 5, 6 or 7 atoms all possibly carrying one or more substituents chosen from the group consisting of Cl, Br, CN, OH, SH, $C_1$-$C_8$ alkyl, $C_2$-$C_{10}$ alkenyl, $C_3$-$C_7$ cycloalkyl, $C_6$-$C_{14}$ aryl, —O—$R^4$, —S—$R^4$, —S(O)$R^4$, —S(O)$_2$—$R^4$, —COO—$R^4$—, S(O)$_2$—N($R^5$)($R^6$), —N($R^5$)($R^6$), —CO—$R^1$—S and (X)($X^1$)—$R^2$, or signifies —O$R^4$ or —N($R^5$)($R^6$);

$R^1$ signifies: direct bond, $C_1$-$C_6$ alkylene, $C_2$-$C_{18}$ alkylidene, $C_3$-$C_7$ cycloalkylidene, polyvinylidene, $C_3$-$C_7$ oxa-, thia-, S—oxothia-, S—dioxothia- or $R^3$—aza-cycloalkylidene, $C_2$-$C_{10}$ alkenylene, $C_1$-$C_4$ alkylene(arylene) in which the aryl can be phenyl, pyridyl, thiophenyl or furanyl, or together with $R^2$ represents a methenyl or methenylarylene group all possibly carrying one or more members chosen from the group consisting of $C_1$-$C_4$ alkyl, $C_3$-$C_6$ cycloalkyl, aryl, halogen, —OH, —SH, —O—$R^4$, —CO—R, —S(X)($X^1$)$R^2$, N($R^5$)($R^6$), —S—$R^4$, —S(O)—$R^4$, —S(O)$_2$—$R^4$ and —COO—$R^4$, or $R^1$ signifies $R^5$—N=;

$R^2$ signifies: direct bond with R or $R^1$, hydrogen, $C_1$-$C_{18}$ linear or branched alkyl, $C_3$-$C_7$ cycloalkyl, $C_3$-$C_7$ oxa-, thia-, S—oxothia-, S—dioxothia- or $R^3$—aza-cycloalkyl possibly carrying ethylenic unsaturations. $C_6$-$C_{14}$ aryl, polyaryl, poly(arylalkenyl), polyacryloyloxyarylene. heterocyclic ring with 5, 6 or 7 atoms containing one or more equal or different heteroatoms, or an amidino or amhydrazino group, possibly salified with organic or inorganic acids, all possibly carrying one or more substituents chosen from the group consisting of —Cl, —Br, —CN, —OH, —SH, $C_1$-$C_8$ alkyl, $C_2$-$C_{10}$ alkenyl, $C_3$-$C_7$ cycloalkyl, —O—$R^4$, —S—$R^4$, —S(O)—$R^4$, —S(O)$_2$—$R^4$, —COO—$R^4$, —S(O)$_2$—N($R^5$)($R^6$), —N($R^5$)($R^6$) and —S(X)(X$^1$)—$R^1$—COR, or $R^2$ represents N($R^5$)($R^6$), —SO$_3$H possibly salified with organic or inorganic bases, —SO$_3R^4$, —(S)$_n$—$R^3$, —[S(X)(X$^1$)]$_n$—$R^3$, (S)$_n$—N($R^5$)($R^6$) where n varies from 1 to 10, —OH, —SH, O$R^4$, —Cl, —Br, —CN, —COO—$R^4$, —C(S)—$R^3$, —C(S)—N($R^5$)($R^6$), —S—(X)(X$^1$)—$R^1$—COR, or —$R^1$—COR;

X and X$^1$, which can be equal or different, each independently represent an electronic doublet, O, S, NH, =N$R^4$, =N—COO—$R^4$ or =N—SO$_2$—R;

$R^3$ represents H, $C_1$-$C_8$ alkyl or phenyl;

$R^4$ represents $C_1$-$C_8$ alkyl, (dialkylamino), (alkoxy) or (hydroxy)alkyl, $C_3$-$C_7$ cycloalkyl, $C_6$-$C_{14}$ aryl or —Si($R^3$)($R^4$)($R^5$);

$R^5$ and $R^6$, which can be equal or different, each independently represent hydrogen, $C_1$-$C_{12}$ alkyl, $C_3$-$C_7$ cycloalkyl, phenyl or —O—$R^4$, or if coincident represent $C_2$-$C_6$ alkylene, $C_2$-$C_6$ oxa-, thia-, —S—oxothia-, —S—dioxothia- or $R^3$—aza-alkylene;

R, $R^1$ and $R^2$ can mutually cyclise; R, $R^1$ and $R^2$ can also represent polymer chains.

Preferred photoinitiators are those compounds of formula (I) in which

R signifies: linear or branched $C_1$-$C_{18}$ alkyl, $C_3$-$C_7$ cycloalkyl, $C_6$-$C_{14}$ aryl, possibly substituted with —Cl, —OH, —SH, —$C_1$-$C_8$ alkyl, $C_6$-$C_{14}$ aryl, O$R^4$ or S$R^4$;

$R^1$ signifies: direct bond, or $C_1$-$C_6$ alkylene, $C_2$-$C_{18}$ alkylidene or $C_3$-$C_7$ cycloalkylidene, possibly substituted with —O$R^4$ or —N($R^5$)($R^6$);

$R^2$ signifies: linear or branched $C_1$-$C_{18}$ alkyl, $C_3$-$C_7$ cycloalkyl or $C_6$-$C_{14}$ aryl, possibly substituted with —Cl, —OH, —SH, $C_1$-$C_8$ alkyl, $C_6$-$C_{14}$ aryl, —N($R^5$)($R^6$), —O$R^4$, —S$R^4$, or signifies —O$R^4$, —$R^1$—CO—R, —SO$_3$H or —OH, possibly salified with organic or inorganic bases;

X and X$^1$ each independently represent an electronic doublet or oxygen;

$R^4$ represents $C_1$-$C_8$ alkyl, $C_6$-$C_{14}$ aryl, dialkylaminoalkyl or alkoxyalkyl;

$R^5$ and $R^6$ have the significance already stated.

Particularly preferred as photoinitiators for transparent acrylic systems or as photochemically releasable latent acid catalysts useful for transparent polycondensable systems are those compounds of formula (I) in which $R^1$ is —C($R^7$)($R^8$)— as represented by general formula (II):

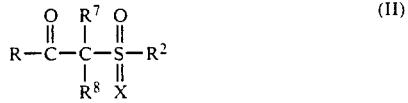

in which

R signifies a linear or branched alkyl or $C_6$-$C_{14}$ aryl, possibly substituted with —Cl, $C_1$-$C_8$ alkyl, —S$R^4$;

$R^2$ signifies linear or branched $C_1$-$C_{18}$ alkyl or $C_6$-$C_{14}$ aryl, possibly substituted with —Cl, $C_1$-$C_8$ alkyl, phenyl, —N($R^5$)($R^6$);

$R^7$ and $R^8$, which can be equal or different, each independently represent a hydrogen atom, $C_1$-$C_8$ alkyl or $C_3$-$C_7$ cycloalkyl, or together represent $C_2$-$C_6$ alkylene or $R^3$—aza-alkylene, all possibly carrying substituents of the type —O$R^4$, —N($R^5$)($R^6$);

X signifies an electronic doublet or an oxygen atom;

$R^4$ signifies $C_1$-$C_8$ alkyl, dialkylaminoalkyl, alkoxyalkyl or phenyl;

$R^3$, $R^5$ and $R^6$ have the significance already described.

Particularly preferred as photoinitiators for pigmented acrylic systems or as photochemically releasable latent acid catalysts useful for pigmented polycondensable systems are those compounds of formula (II) in which R signifies $C_6$-$C_{14}$ aryl substituted with —S$R^4$ and possibly with —Cl or $C_1$-$C_8$ alkyl;

$R^2$ signifies linear or branched $C_1$-$C_{18}$ alkyl, or $C_6$-$C_{14}$ aryl possibly substituted with —Cl, —N($R^5$)($R^6$);

$R^3$, $R^4$, $R^5$, $R^6$, $R^7$ and $R^8$ have the significance already described in the preceding case.

Particularly preferred as photoinitiators for the polymerisation of monomer and acrylic and methacrylic oligomer systems when used in aqueous solution are those compounds represented by general formula (III):

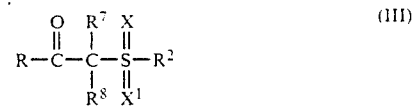

in which

R signifies linear or branched $C_1$-$C_{18}$ alkyl, $C_3$-$C_7$ cycloalkyl or $C_6$-$C_{14}$ aryl, possibly substituted with —Cl, —OH, —SH, $C_1$-$C_8$ alkyl, $C_6$-$C_{14}$ aryl, —O$R^4$ or —S$R^4$;

$R^2$ signifies —OH, —SH or —SO$_3$H, possibly salified with organic or inorganic bases;

$R^7$ and $R^8$, which can be equal or different, each independently represent a hydrogen atom, $C_1$-$C_8$ alkyl, or or $C_3$-$C_7$ cycloalkyl, or together represent $C_2$-$C_6$ alkylene, or $R^3$—aza-alkylene, all possibly carrying substituents of the —O$R^4$, —N($R^5$)($R^6$) type;

X and X$^1$, which can be equal or different, each independently represent an electronic doublet, O, S, =N$R^4$, =N—COO$R^4$ or =N—SO$_2$R;

$R^4$, $R^5$ and $R^6$ have the significance already described in the preceding case.

Of the compounds defined heretofore, some are known while others are new.

Examples of compounds suitable for the application according to the present invention are the following:
2-phenylsulphonyl-2-methyl-propiophenone
2(4-chlorophenylsulphonyl)-2-methyl-propiophenone
2-(4-methylphenylsulphonyl)-2-methyl-propiophenone
2-(4-methoxyphenylsulphonyl)-2-methyl-propiophenone
2-(4-dimethylaminophenylsulphonyl)-2-methyl-propiophenone
2-phenylsulphinyl-2-methyl-propiophenone 2-(4-dimethylaminophenylsulphinyl)-2-methyl-propiophenone
bis(2-benzoylpropyl)sulphone
2-methylsulphonyl-2-methyl-propiophenone
2-tert.butylsulphonyl-2-methyl-propiophenone
2-(5-methyl-1,3,4-thiadiazolyl-2-thio)-2-methyl-propiophenone
2-morpholinothio-2-methyl-propiophenone
2-morpholinosulphinyl-2-methyl-propiophenone
2-morpholinosulphonyl-2-methyl-propiophenone
sodium S-(2-oxo-2-phenyl-1,1-dimethylethyl)-thiosulphate
methyl S-(2-oxo-2-phenyl-1,1-dimethylethyl)-thiosulphate
(2-oxo-2-phenyl-1,1-dimethylethyl)-sulphonic acid and its salts
methyl (2-oxo-2-phenyl-1,1-dimethylethyl)-sulphonate
2-methylsulphonylacetophenone
2-n-butoxycarbonylmethylsulphonylacetophenone
2-phenylsulphonylacetophenone
2-(4-chlorophenyl)sulphonylacetophenone
2-(4-methylphenyl)sulphonylacetophenone
bis-(benzoylmethyl)sulphone
2-phenylsulphonylpropiophenone
2-phenylsulphonyl-2-n-butyl-n-butyrophenone
1-phenylsulphonyl-1-benzoylcyclohexane
phenylsulphonyl-bis-benzoylmethane
2(bis-phenylsulphonyl)-2-phenylacetophenone
2-(4-chlorophenylsulphonyl)propiophenone
2-methylthio-2-hydroxyacetophenone
2-methylsulphonyl-2-hydroxyacetophenone
2-methylsulphonyl-2-methoxyacetophenone
2-methylsulphonyl-2,2-dimetyoxyacetophenone
4-methylsulphonylmethylbenzophenone
4-phenylsulphonylmethylbenzophenone
1-phenylsulphonyl-2-propanone
1-t-butyl-2-phenylsulphonyl-1-ethanone
1-t-butyl-2,2-dimethyl-2-phenylsulphonyl-1-ethanone
2-methylsulphonyl-(4'-phenylacetophenone)
2-methylsulphonyl-(4'-dimethylaminoacetophenone)
2-phenylsulphonyl-2,2-dimethyl-(2',4',6'-trimethylacetophenone)
2-phenylsulphonyl-2,2-dimethyl-(4'-dimethylaminoacetophenone)
2-phenylthio-2-methyl-1-(4-methylthio)phenyl-1-propanone
2-phenylsulphinyl-2-methyl-1-(4-methylthio)phenyl-1-propanone
2-phenylsulphonyl-2-methyl-1-(4-methylthio)phenyl-1-propanone
2-methylsulphonyl-2-methyl-1-(4-methylthio)phenyl-1-propanone
2-(4-dimethylaminophenyl)sulphonyl-2-methyl-1-(4-methylthio)phenyl-1-propanone
2-n-butyl-2-phenylsulphonyl-1-(4-methylthio)phenyl-1-butanone
2-morpholinomethyl-2-phenylsulphonyl-1-(4-methylthio)phenyl-1-propanone
2-phenylsulphonyl-2-methyl-1-(4-phenylthio)phenyl-1-propanone
2-phenylsulphonyl-2-methyl-1-(4-dimethylaminoethylthio)phenyl-1-propanone
2-phenylsulphonyl-2-methyl-1-(4-methylsulphinyl)phenyl-1-propanone
2-phenylsulphonyl-2-methyl-1-(4-methylsulphonyl)phenyl-1-propanone
1-phenyl-1-phenylsulphonylmethanone
1-phenylsulphonyl-1-ethanone
1-phenylsulphonyl-2,2-dimethyl-1-propanone
1-phenylsulphonyl-1-(2,4,6-trimethylphenyl)-methanone and also those represented by the following structural formulas (where n varies from 2 to 2000):

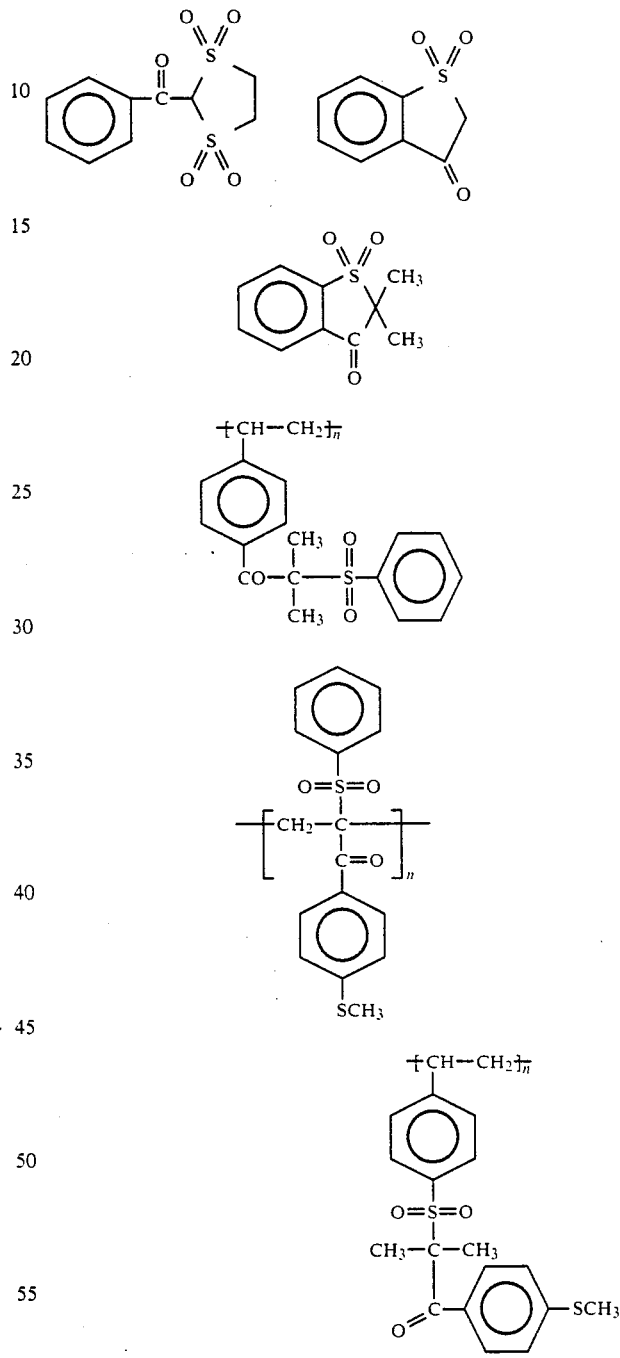

The compounds of formula (I) and (II) according to the present invention can be prepared by known methods of organic chemistry. By way of non-limiting example a description is given hereinafter of those synthesis methods useful for preparing beta ketosulphoxides and beta ketosulphones ascribable to formula (II), and beta ketothiosulphates and beta ketosulphates ascribable to formula (III), and which are preferred according to the present invention. In formulas (III) to (XIII), X signifies a chlorine or bromine atom.

A. PREPARATION OF BETA KETOSULPHOXIDES

A.1. Preparation of Beta Ketosulphides and Subsequent Oxidation to Sulphoxides The beta ketosulphides can be obtained in various ways, of which the following are examples:

(a) reaction of alpha haloketones with mercaptans in the presence of hydrogen halide acid acceptor bases.

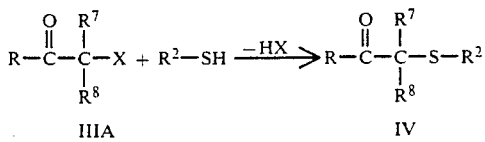

The reaction can be implemented under a variety of conditions in the homogeneous phase as reported for example by Houben Weyl, vol. VII/2C, page 2351 (1977) or in the presence of phase transfer agents as reported by M. Lissel, J. Chem. Res. Synop., (10), 286 (1982).

(b) sulphenylation of ketones and their derivatives.

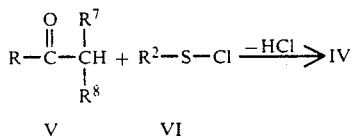

The reaction can be conducted directly between the sulphenic acid chloride and the ketone in the presence of a hydrochloric acid acceptor base or by separating the hydrochloric acid evolved [Houben Weyl, Vol. VII/2C, page 2364 (1977)].

Another method is to react the sulphenic acid chloride with the lithium salt of the enol ketone [D. Seebach et al., Chem. Ber., 109, 1601 (1976)].

(c) alkylation or arylation of alpha mercaptoketones.

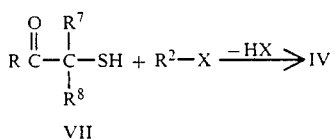

The reaction is particularly convenient when efficient alkylating agents can be used such as dimethylsulphate or alpha haloketones.

The oxidation of beta ketosulphides (IV) to beta ketosulphoxides (VIII)

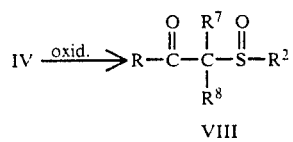

can be effected by the normal oxidising agents such as organic peracids, organic persalts, hydrogen peroxide, sodium perborate or halogens in the presence of alkalis in two-phase systems, under the most varied experimental conditions.

A.2. Sulphinylation of Ketones

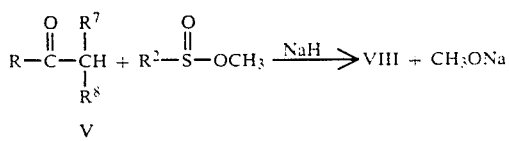

Examples are reported by R. M. Coates et al. (Synthesis, 1975, 319) and S. Iriuchijima et al. (Synthesis, 1975, 401).

A.3. Corey Synthesis and Analogues

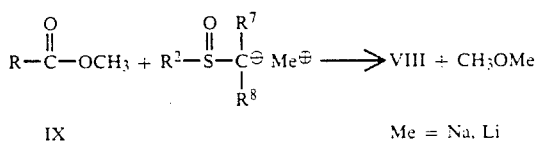

The Corey synthesis [E. J. Corey et al., J. Amer. Chem. Soc., 87, 1345 (1965)] is very useful when methylsulphoxides are to be obtained from methylesters IX and methylsulphinylcarbanion prepared from dimethylsulphoxide:

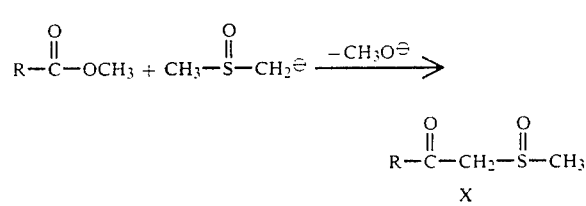

These beta ketosulphoxides can be easily alkylated to obtain more greatly substituted compounds of formula (VIII) [P. G. Gassman et al., J. Org. Chem., 31, 2355 (1966)].

B. PREPARATION OF BETA KETOSULPHONES

B.1. Oxidation of Beta Ketosulphoxides or Double Oxidation of Beta Ketosulphides

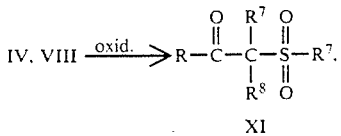

The most used reagents are hydrogen peroxide in acetic acid or peracetic acid, or sodium borate [A. McKillop et al., Te. Le. 24, (14) 1505 (1983)].

B.2. Sulphonylation of Alpha Haloketones

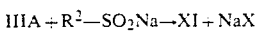

The reaction is conducted between the haloketone and the sulphinic acid sodium salt generally in a dipolar aprotic solvent. The method is simple and generally applicable [B. M. Trost, Chem. Rev., 78, (4) page 369 (1978)].

B.3. Sulphonylation of Enol Ketones

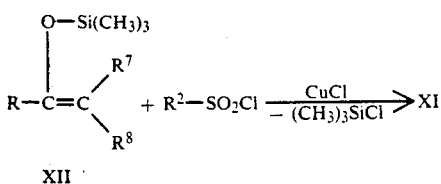

XII

The reaction is conducted in acetonitrile and is generally applicable [Y. Kuroki et al., Organometal. Chem. Synth., 1, 465 (1972)].

B.4. Condensation of Alkylsulphones with Esters by the Action of Alkaline Agents

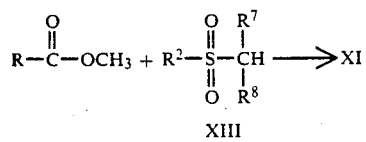

XIII

The reaction can be conducted in the presence of n-butyllithium operating at −30° C. in THF [Truce et al., J. Org. Chem., 35, page 1883 (1970)] or by using ethylmagnesium bromide in aromatic solvents under reflux [L. Field et al., J. Amer. Chem. Soc., 78, 4389 (1956)].

If the beta ketosulphones (XI) have hydrogens adjacent to the sulphonyl group, they can be alkylated by alkylating agents in the presence of sodium methylate [E. P. Kohler et al., J. Amer. Chem. Soc., 58, 2166 (1936)] or sodium hydride (D. Scholz, Liebigs Ann. Chem., 1983, 98) to obtain compounds of formula (XI) with greater substitution.

C. Preparation of Beta Ketothiosulphates

Nucleophilic substitution of alpha haloketones by the thiosulphate ion to obtain "Bunte salts" (XIV):

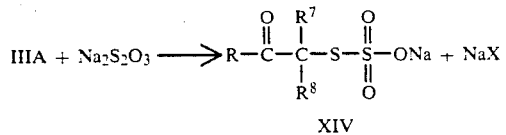

XIV

The reaction is conducted between the haloketone and sodium thiosulphate in a hydroalcoholic solvent or in a dipolar aprotic solvent depending on the solubility and reactivity of the haloketone. [H. Bunte, Ber., 7, 645 (1874), F. Asinger et al., Annalen, 637, 146 (1960)].

The following non-limiting examples, given to illustrate the invention, describe the preparation of compounds of formula (I) and (II).

The parts and percentages are expressed by weight, the infrared spectra were obtained by a Perkin Elmer 599 spectrophotometer, the $R_f$ values were measured by thin layer chromatography (silica gel 0.25 mm, with fluorescence indicator).

PREPARATION OF BETA KETOSULPHIDES

Example 1a —Preparation of 2-phenylthio-2-methylpropiophenone 10.88 g of a 50% suspension of sodium hydride in paraffin mineral oil are fed into 100 ml of DMF, followed slowly by 25.11 g of thiophenol. When dissolution is complete (65° C.), the solution is cooled to 2° C. and 36.5 g of 2-chloro-2-methylpropiophenone are fed in over 30 minutes maintaining the temperature below 10° C.

The mixture is agitated for 4 hours at 20° C. and for 1 hour at 40° C. It is diluted with 200 ml of water, extracted with 200 ml of ethyl ether, washed with 20 ml of a 10% NaOH solution, and then with water to pH 7. It is dried over $Na_2SO_4$ and the solvent evaporated to obtain 51 g of a crude crystalline solid product of M.P. 18°–20° C., $R_f$(toluene) 0.53, and the following IR spectrum (absorptions, $cm^{-1}$): 1670, 1457, 1260, 974, 700, 689.

The beta ketosulphides reported in Table 1 were obtained in an analogous manner from the corresponding haloketones using the suitable mercaptan.

PREPARATION OF BETA KETOSULPHOXIDES

Example 2a—Preparation of 2-phenylsulphinyl-2-methylpropiophenone 68 g of 2-phenylthio-2-methylpropiophenone (1a) are added at 0° C. to a solution prepared from 500 ml of glacial acetic acid, 47 g of acetic anhydride and 45.5 g of 33% hydrogen peroxide. After 48 hours of agitation at ambient temperature, it is taken up in ethyl ether, washed with water and neutralised with sodium bicarbonate.

TABLE 1

| Ex. | Structure | Mercaptan | Isolation | M.P. (°C.) (phys. state) | $R_f$ | IR Spectrum absorption ($cm^{-1}$) |
|---|---|---|---|---|---|---|
| 1 b | 2,4,6-$(CH_3)_3$—$C_6H_2$—CO—$C(CH_3)_2$—S—$C_6H_5$ | $C_6H_5SH$ | E | — | 0.48 | 1690, 850, 735, 685 |
| 1 c | 2,4,6-$(CH_3)_3$—$C_6H_2$—CO—$CH_2$—S—$C_6H_5$ | $C_6H_5SH$ | cc | (liquid) | 0.48 | 1690, 845, 730, 690 |
| 1 d | $C_6H_5$—CO—$CH_2$—S—$C_6H_5$ | $C_6H_5SH$ | xx | 54 | 0.49 | 1680, 1275, 745, 680 |
| 1 e | [$C_6H_5$—CO—$C(CH_3)_2$]$_2$S | $Na_2S$ | cc | — | 0.345 | 1670, 1260, 975, 705 |
| 1 f | $C_6H_5$—CO—$C(CH_3)_2$S—$C(NH_2)_2^+$ $Br^-$ | S=$C(NH_2)_2$ | E | (liquid) | — | 1675, 1630, 1045, 700 |
| 1 g | $C_6H_5$—CO—$CH_2$—S—$C_{12}H_{25}$ | $C_{12}H_{25}SH$ | cc | 20 | 0.59 | 1675, 1275, 720, 685 |
| 1 h | $(C_6H_5$—CO—$CH_2)_2$—S | $Na_2S$ | cc | 75–79 | 0.27 | 1693, 1175, 980, 750 |
| 1 i | $C_6H_5$—CO—$CH_2$—S—$SO_3Na$ | $Na_2S_2O_3$ | xx | (solid) | — | 1680, 1205, 1045, 680 |
| 1 l | $C_6H_5$—CO—$CH_2$—S—$CH_2$—COO-i-$C_4H_9$ | i-$C_4H_9OCOCH_2SH$ | cc | 20 | 0.25 | 1725, 1675, 1275, 1000 |
| 1 m | $(C_6H_5$—CO—$CH_2$—S—$)_2$ | $Na_2S_2$ | E | (liquid) | — | 1670, 1270, 1190, 980 |
| 1 n | 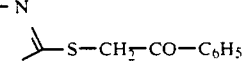 $C_6H_5$—CO—$CH_2$—S—⟨N-N / S⟩—S—$CH_2$—CO—$C_6H_5$ | HS—⟨N-N / S⟩—SH | cc | 99 | 0.54 (2) | 1675, 1275, 1197, 745 |
| 1 o | $C_6H_5$—CO—CH(OH)—$SCH_3$ | (1) | xx | 103– | 0.65 (2) | 3440, 1673, 1255, 1090 |

TABLE 1-continued

| Ex. | Structure | Mercaptan | Isolation | M.P. (°C.) (phys. state) | $R_f$ | IR Spectrum absorption (cm$^{-1}$) |
|---|---|---|---|---|---|---|
| | | | | 105 | | |

(1) obtained by rearranging 2 p (Table 2) with 37% hydrochloric acid (Org. Synth. Coll. Vol. V, page 937)
(2) eluent toluene 70 - ethyl acetate 30
E = extraction with solvent; xx = crystallisation; cc = chromatography in silica gel column After evaporating the solvent, the residue is taken up in petroleum ether and crystallised to obtain 38.2 g of crystalline solid product of M.P. 65°–70° C., $R_f$ (toluene) 0.22, and the following IR spectrum (absorptions, cm$^{-1}$): 1658, 1443, 1258, 1050, 745, 689.

The beta ketosulphoxides of Table 2 were obtained in an analogous manner from the corresponding beta ketosulphides of Table 1. The characteristics are indicated in Table 2.

PREPARATION OF BETA KETOSULPHONES

Example 3a—Preparation of 2-phenylsulphonyl-2-methylpropiophenone 19 g of 2-phenylthio-2-methylpropiophenone (1a) in 100 ml of glacial acetic acid are treated with 21.6 g of 33% hydrogen peroxide, and then heated to 80° C.

After 3 hours of agitation at 80° C. the reaction mixture is treated as in Example 2, and the residue crystallised from methanol to obtain 16.6 g of a solid crystalline product of M.P. 70° C., $R_f$ (toluene) 0.31, and the following IR spectrum (absorptions, cm$^{-1}$): 1680, 1450, 1300, 1255, 1124, 962, 690, 603.

The beta ketosulphones of Table 3 were obtained in an analogous manner from the corresponding beta ketosulphides of Table 1. Characteristics are given in Table 3.

ALTERNATIVE PREPARATION OF BETA KETOSULPHONES

Example 4a—Alternative preparation of 2-phenylsulphonyl-2-methylpropiophenone 27.2 g of 2-bromo-2-methylpropiophenone are dissolved in 100 ml of DMSO and treated with 20.13 g of anhydrous sodium phenylsulphinate. The temperature rises from 23° to 46° C. during which a crystalline solid mass precipitates. After agitation overnight at ambient temperature, a further 80 ml of DMSO are added and the mixture agitated for 4 hours.

TABLE 2

| Ex. | Structure | Isolation | M.P. (°C.) (phys. state) | $R_f$ (toluene 70-ethyl acetate 30) | IR Spectrum absorptions (cm$^{-1}$) |
|---|---|---|---|---|---|
| 2 b | 2,4,6-(CH$_3$)$_3$—C$_6$H$_2$—CO—C(CH$_3$)$_2$—S(O)—C$_6$H$_5$ | cc | (liquid) | 0.44 | 1662, 1440, 1100, 740 |
| 2 c | 2,4,6-(CH$_3$)$_3$—C$_6$H$_2$—CO—CH$_2$—S(O)—C$_6$H$_5$ | cc | — | 0.42 | 1695, 1440, 1265, 1045, 745 |
| 2 d | C$_6$H$_5$—CO—CH$_2$—S(O)—C$_6$H$_5$ | xx | 68–70 | 0.30 (2) | 1672, 1445, 1273, 1040, 745, 683 |
| 2 g | C$_6$H$_5$—CO—CH$_2$—S(O)—C$_{12}$H$_{25}$ | E | 20 | 0.49 | 1685, 1675, 1468, 1020, 730 |
| 2 h | (C$_6$H$_5$—CO—CH$_2$)$_2$—S=O | xx | — | 0.14 | 1670, 1445, 1278, 1030, 680 |
| 2 l | C$_6$H$_5$—CO—CH$_2$—S(O)—CH$_2$—COO-i-C$_4$H$_9$ | cc | 20 | 0.70 | 1725, 1675, 1280, 1050, 1000, 750, 683 |
| 2 n | C$_6$H$_5$—CO—CH$_2$—S(O)—⟨N=N, S⟩—S(O)—CH$_2$—CO—C$_6$H$_5$ | cc | — | 0.46 | 1680, 1449, 1070, 990, 750, 684 |
| 2 p | C$_6$H$_5$—CO—CH$_2$—S(O)—CH$_3$ (1) | xx | 82 | — | 1670, 1420, 1300, 1200, 1030 |

(1) Obtained from methylbenzoate by the method of G. J. Mikol and G. A. Russel (Org. Synth. Coll. Vol. V, page 937)
(2) Eluent: toluene
E = extraction with solvent; xx = crystallisation; cc = chromatography in silica gel column

TABLE 3

| Ex. | Structure | Isolation | M.P. (°C.) (phys. state) | $R_f$ (toluene 70-ethyl acetate 30) | IR Spectrum absorptions (cm$^{-1}$) |
|---|---|---|---|---|---|
| 3 c | 2,4,6-(CH$_3$)$_3$—C$_6$H$_2$—CO—CH$_2$—S(O)$_2$—C$_6$H$_5$ | cc | 70–73 | 0.72 | 1690, 1310, 1155, 990 |
| 3 d | C$_6$H$_5$—CO—CH$_2$—S(O)$_2$—C$_6$H$_5$ | xx (CH$_3$OH) | 75–79 | 0.13 | 1675, 1280, 1030, 990, 683 |
| 3 e | [C$_6$H$_5$—CO—C(CH$_3$)$_2$]$_2$—S(O)$_2$ | cc | 60–67 | 0.49 (2) | 1675, 1290, 1097, 965, 735, 700 |
| 3 p | C$_6$H$_5$—CO—CH$_2$—S(O)$_2$—CH$_3$ (1) | xx | 87 | 0.4 | 1675, 1300, 1150, 970, 690 |

(1) Obtained by oxidation of the sulphoxide 2 p
(2) Eluent: toluene
cc = chromatography in silica gel column; xx = crystallisation It is diluted with water, extracted with ether, and after evaporating the solvent 32.5 g of product are obtained, which is then crystallised from methanol. The white crystalline solid obtained is of M.P. 70° C., $R_f$(toluene) 0.31, and has a IR spectrum identical to that of Example 3a.

The beta sulphonyl ketones of which the characteristics are indicated in Table 4 are obtained in an analogous manner.

PREPARATION OF BETA KETOTHIOSULPHATES ("BUNTE SALTS")

Example 5a—Preparation of sodium S-(2-oxo-2-phenyl-1,1-dimethylethyl)-thiosulphate 20.2 g of 2-chloro-2-methylpropiophenone are dissolved in 70 ml of dimethylsulphoxide and treated with 27.4 g of sodium thiosulphate pentahydrate. After agitation for 12 hours at 20° C., 3 hours at 80° C. and 2 hours at 120° C., the mixture is cooled and diluted with ethyl ether. The aqueous phase is washed with ethyl ether, then taken up in anhydrous ethyl alcohol and filtered. The clear filtrate is evaporated to dryness and dried azeotropically to obtain 74.7 g of a crude product having an oily appearance, and consisting of a 40% solution of the required compound in dimethylsulphoxide. It shows a IR spectrum with characteristic bands at (absorptions, cm$^{-1}$): 1670, 1595, 1260, 1170, 1130, 1030, 705, 610, 600. The reaction product is used without further purification for the photoinitiated polymerisation experiments.

According to the present invention the compounds of formula (I), (II) and (III) can be used (a) as polymerisation or crosslinking photoinitiators for transparent or pigmented systems containing monomers, oligomers or polymers with ethylenic unsaturations, particularly for acrylic systems, (b) as photochemically releasable latent acid catalysts useful for systems which harden by means of polycondensation catalysed by acids.

acrylonitrile; acrylamide and its derivatives; esters formed from vinyl alcohol and aliphatic acids or acrylic acid; vinyl ethers; N-vinylpyrrolidone, mono and polyfunctional allyl ethers such as trimethylolpropanediallyl ether; styrene and alphamethylstyrene.

Oligomers containing double ethylenic bonds include polyesters, polyacrylates, polyurethanes, epoxides, and modified polyethers with acrylic, fumaric, maleic or other functionality.

Suitable polymers include unsaturated polyesters which in combination with styrene represent one of the most widespread systems in the paint industry.

(B) Polycondensable systems.

Compounds which can be polycondensed by acid catalysis include melamine resins, urea resins, glycourea resins, benzoguanamine resins etc. of different degrees and types of etherification, in combination with various compounds containing mobile hydrogens such as resins of various types containing hydroxyl, carboxyl, amido, amino, thiol and other functionality. Examples of these resins are acrylic, polyester, alkyd, phenolic and polyvinyl resins, or their mixtures.

(C) Hybrid systems.

It is also possible to use the compounds of formula (I), (II) and (III) as photoinitiators and simultaneously as photochemically releasable latent catalysts in hybrid systems containing at the same time the compounds described under points (A) and (B); particularly useful hybrid systems are those which in addition to crosslinking agents of aminoplastic type also contain monomers of double functionality (ethylenic unsaturations and mobile hydrogens) such as hydroxyethylacrylate and methacrylate, acrylamide, N-hydroxymethylacrylamide, and products of the reaction between bisphenol-A-bis-glycidylether or glycidyl-(meth)acrylate and mono and polybasic unsaturated acids.

TABLE 4

| Ex. | Structure | Isolation | M.P. (°C.) (phys. state) | $R_f$ (toluene) | IR Spectrum absorptions (cm$^{-1}$) |
|---|---|---|---|---|---|
| 4 q | $C_6H_5$—CO—CH(CH$_3$)—S(O)$_2$—$C_6H_5$ | xx (CH$_3$OH) | 77–79 | 0.45 (1) | 1670, 1445, 1320, 1140, 1075, 990 |
| 4 r | 4-(CH$_3$—S)—$C_6H_4$—CO—CH(CH$_3$)—S(O)$_2$—$C_6H_5$ | xx (Et$_2$O-EtPet) | 123–124 | 0.34 | 1670, 1585, 1300, 1142, 944, 835 |
| 4 s | 4-($C_6H_5$—S)—$C_6H_4$—CO—C(CH$_3$)$_2$—S(O)$_2$—$C_6H_5$ | cc | 87–90 | 0.16 | 1670, 1590, 1370, 1310, 1155, 1080 |
| 4 t | 4-(CH$_3$—S)—$C_6H_4$—CO—C(CH$_3$)$_2$—S(O)$_2$—$C_6H_5$ | xx (CH$_3$OH) | 108–110 | 0.18 | 1665, 1587, 1296, 1245, 1130, 950 |
| 4 u | CH$_3$—CO—CH$_2$—S(O)$_2$—$C_6H_5$ | xx (ET$_2$O/toluene) | 53 | 0.47 (1) | 1725, 1300, 1150, 1085, 1000 |
| 4 v | $C_6H_5$—CO—C(CH$_3$)$_2$—S(O)$_2$—$C_6H_4$-4-(Cl) | xx ($C_2H_5$OH) | 61–63 | 0.22 | 1668, 1310, 1150, 1080, 760 |
| 4 z | $C_6H_5$—CO—CH($C_6H_5$)—S(O)$_2$—$C_6H_5$ | xx (Et Pet) | 140 | 0.17 | 1685, 1309, 1270, 1140, 1080, 985, 590 |
| 4 x | 4-(CH$_3$S)—$C_6H_4$—CO—C(CH$_3$)$_2$—S(O)$_2$—$C_6H_4$-4-(CH$_3$) | xx (CH$_3$OH) | 99 | 0.28 | 1655, 1582, 1290, 1160, 1095, 970, 770, 665, 595 |
| 4 y | $C_6H_5$—CO—C(CH$_3$)$_2$—S(O)$_2$—(CH$_3$) | xx | 55 | 0.4 (1) | 1675, 1295, 1250, 1115, 950, 775, 700 |
| 4 w | $C_6H_5$—CO—C(CH$_3$)$_2$—S(O)$_2$—$C_6H_4$-4-(CH$_3$) | xx (CH$_3$OH/ Pet. Ether) | 58 | 0.44 | 1690, 1597, 1303, 1290, 1260, 1155, 970, 745, 705, 670 |
| 4 j | $C_6H_5$—CO—C(CH$_3$)$_2$—S(O)$_2$—$C_6H_4$-4-(OCG$_3$) | cc | — | 0.05 | 1675, 1595, 1295, 1260, 1147, 1127, 965, 835, 705 |

(1) Eluent: toluene 70 - ethyl acetate 30
xx = crystallisation; cc = chromatography in silica gel column (A) Photopolymerisable systems.

Monomers for acrylic systems include esters formed from acrylic or methacrylic acid and aliphatic alcohols, glycols, polyhydroxylated compounds such as pentaerythritol or trimethylolpropane or amino alcohols;

In addition to the compounds of formula (I), (II) and (III), numerous other components can be included in photopolymerisable systems in order to perform specific functions, such as thermal stabilisers, thermal polymerisation inhibitors, U.V. absorbers, photo-oxidation stabilisers such as sterically hindered amines, antioxidants, chain transfer agents, atmospheric oxygen exclusion agents, generators of radicals by thermal means such as organic and inorganic peroxides, peresters, hydroperoxides, benzopinacoles, azo derivatives such as azobisisobutyronitrile, metallic promoters such as salts of cobalt (II), manganese etc., surface levelling agents, fillers, dyes, organic and inorganic pigments, glass or carbon fibres, or thixotropy agents.

In particular the compounds of formula (III) can be advantageously used as photoinitiators for polymerising acrylic monomers and oligomers dissolved in water: representative examples of monomers photochemically polymerisable in aqueous solution are (meth)acrylic acid and its salts, acrylamide, N-methylolacrylamide etc.

Other components are represented by non-photopolymerisable polymers present as chemically inert substances such as nitrocellulose, polyacrylic esters, polyolefins etc., or polymers crosslinkable by alternative systems, i.e. by peroxides, atmospheric oxygen, acid catalysis, or by thermal activation etc. such as polyisocyanates, urea, melamine or epoxy resins.

The photoinitiators according to the present invention can be used either alone or in combination with other photoinitiators such as benzophenone, benzildimethylketal, 2-hydroxypropylphenylketone, benzoin ethers etc. Particularly advantageous is the combination with tertiary amines which increase the crosslinking rate of the mixtures obtained; particularly useful are dialkylalkanolamines and paradimethylaminobenzoic acid esters.

In particular, in the case of pigmented systems it is very advantageous to use compounds of formula (I), (II) or (III) together with spectral sensitising compounds such as thioxanthones and derivatives, dyes etc., these being present in order to transfer to the photoinitiator the energy absorbed by them in high wavelength spectral regions.

The compounds of formula (I), (II) or (III) are generally used in a quantity varying between 0.01% and 15% and preferably between 0.5% and 5% by weight in systems containing unsaturations of acrylic type or systems hardenable by acid catalysis. Said systems are of transparent or pigmented type, and are mainly intended for painting or decorating articles of the paper industry, plastics materials, metals and wood.

The compounds of formula (I), (II) or (III) generally possess excellent solubility in photopolymerisable systems, to which they impart high photochemical reactivity and allow high darkness stability; in systems polycondensable by acid catalysis they produce very high darkness stability and excellent thermal reactivity after exposure to ultraviolet radiation. The light sources used for photopolymerising or crosslinking films or releasing the latent acid catalyst are mercury vapour lamps of high, medium or low pressure, or superactinic lamps, with emission between 250 and 400 nm; for crosslinking titanium dioxide inks it is preferable to use "doped" lamps with particularly intense emission between 350 and 450 nm.

The initial colour of articles obtained by crosslinking after exposure to the light of said lamps is extremely low. Ageing resistance is also excellent under photooxidative conditions consequent on prolonged exposure to xenon or fluorescent lamps.

These characteristics allow improved use of compounds of formula (I), (II) or (III) in transparent systems and in those pigmented with titanium dioxide.

The following applicational examples are described for illustrative purposes.

Example 6

3 parts of photoinitiator are added to a photo-crosslinkable mixture consisting of 70 parts of acrylated epoxy resin prepared from bisphenol-A-bisglycidylether and acrylic acid, and 30 parts of triethyleneglycol diacrylate, and the resultant mixture is applied by a film spreader to a glass plate to a thickness of 100 microns. After exposure to air for 30 seconds, the films are irradiated by successive passages at a speed of 10 m/min under a medium pressure UV mercury vapour lamp of 40 W/cm power at a distance of 11 cm in a laboratory apparatus of the type obtainable from Steinemann AG, St. Gallen (Switzerland).

Table 5 shows the number of passages necessary to obtain a tack-free (TF) surface; the colour of the film obtained, measured initially (2 hours after crosslinking) and after ageing by exposure for 8 hours to irradiation by a 300 W Ultravitalux ® (Osram) lamp at a distance of 15 cm, defined as the yellowing index (YI) in accordance with ASTM D-1925-63/T; and the storage stability of the liquid composition evaluated in darkness at 60° C.

TABLE 5

| Photoinitiator | No. passages (TF) | YI initial | YI after 8 h | Stability (days) |
|---|---|---|---|---|
| 2,2-dimethoxy-1,2-diphenylethanone (1) | 2 | 25 | 30 | >30 |
| benzophenone (2) | 3 | 4 | 10 | >30 |
| Example 2a | 2 | 1 | 4 | >30 |
| Example 3a | 2 | 1 | 4 | >30 |
| Example 4v | 2 | 1 | 3 | >30 |

(1) and (2): photoinitiators of the known art used for comparison.

From the results of this table it can be seen that the yellowing index is considerably lower when photoinitiators according to the present invention are used than when photoinitiators of the known art are used.

Example 7

3 parts of various photoinitiators are added to 100 parts of a photo-crosslinkable mixture such as that described in Example 6. the compositions obtained are evaluated under the conditions described in said Example 6 to determine the following characteristics: number of passages for obtaining a tack-free (TF) surface; Sward hardness measured in accordance with ASTM D-2134-66 10 minutes after irradiating for the number of passages indicated; and darkness stability at 60° C. The results are shown in Table 6.

TABLE 6

| Photoinitiator | No. passages (TF) | Sward Hardness (passages) | | Darkness stability (days) |
|---|---|---|---|---|
| Example 1c | 6 | 2 (6) | 4 (8) | 2 |
| Example 1o | 5 | 3 (5) | 4 (7) | 2 |
| Example 2a | 2 | 30 (2) | 38 (4) | >30 |
| Example 2d | 3 | 10 (3) | 16 (5) | 3 |
| Example 2p | 3 | 2 (3) | 4 (5) | >30 |
| Example 3d | 3 | 14 (3) | 22 (5) | >30 |
| Example 4a | 2 | 28 (2) | 32 (4) | >30 |
| Example 4q | 2 | — | 1 (4) | >30 |
| Example 4r. | 3 | 26 (3) | 30 (5) | >30 |
| Example 4t | 2 | 36 (2) | 42 (4) | >30 |

TABLE 6-continued

| Photoinitiator | No. passages (TF) | Sward Hardness (passages) | Darkness stability (days) |
|---|---|---|---|
| Example 4u | 8 | — | 2 (10) | >30 |
| Example 4v | 2 | 28 (2) | 38 (4) | >30 |

Example 8

3 parts of N-methyldiethanolamine and 3 parts of various photoinitiators are added to 100 parts of a photo-crosslinkable mixture such as that described in Example 6. The compositions obtained are applied to glass plates to a thickness of 100 microns, and after 30 seconds of exposure to air the films are irradiated by successive passages at a speed of 15 m/min under a 40 W/cm UV lamp in an apparatus such as that described in Example 6. The results obtained are given in Table 7.

TABLE 7

| Photo-initiator | No. passages (TF) | Sward Hardness (passages) | Initial YI | Darkness stability (days) |
|---|---|---|---|---|
| Example 1g | 2 | — | 4 (6) | 2 | 8 |
| Example 1o | 2 | — | 2 (6) | 3.5 | 2 |
| Example 2a | 1 | 12 (1) | 27 (5) | 3 | >20 |
| Example 2d | 2 | — | 6 (5) | 2 | 2 |
| Example 2p | 2 | — | 4 (6) | 2 | >20 |
| Example 3d | 1 | 10 (1) | 20 (5) | 2 | >20 |
| Example 4a | 1 | 12 (1) | 24 (5) | 1 | >20 |
| Example 4q | 1 | 8 (1) | 22 (5) | 2 | >20 |
| Example 4r | 1 | 18 (1) | 22 (5) | 4 | >20 |
| Example 4t | 1 | 18 (1) | 27 (5) | 4 | >20 |
| Example 4u | 2 | — | 4 (6) | 3 | >20 |
| Example 4v | 1 | 10 (1) | 22 (5) | 1 | >20 |

The addition of tertiary amines increases reactivity, so that the number of necessary passages is reduced.

Example 9

Various quantities of photoinitiator and N-dimethyldiethanolamine in a quantity of 1.5 times the weight of the photoinitiator are added to 100 parts of Laromer ® LR 8496 (aliphatic acrylic resin available from BASF AG, Ludwigshafen). The compositions are applied to a glass plate to a thickness of 50 microns and the films are irradiated by one passage at 5 m/min under an 80 W/cm UV lamp. The results are given in Table 8.

TABLE 8

| Photoinitiator | Quantity (g/100 g resin) | Sward Hardness | Initial YI |
|---|---|---|---|
| Example 2a | 3 | 14 | 2 |
|  | 1.5 | 12 |  |
|  | 0.75 | 10 |  |
| Example 3d | 3 | 18 | 3 |
|  | 1.5 | 14 |  |
|  | 0.75 | 10 |  |
| Example 4a | 3 | 12 | 2 |
|  | 1.5 | 10 |  |
|  | 0.75 | 6 |  |
| Example 4r | 3 | 18 | 8 |
|  | 1.5 | 16 |  |
|  | 0.75 | 10 |  |
| Exmple 4t | 3 | 18 | 5 |
|  | 1.5 | 16 |  |
|  | 0.75 | 10 |  |
| Example 4v | 3 | 14 | 1 |
|  | 1.5 | 10 |  |
|  | 0.75 | 8 |  |

Example 10

3 parts of photoinitiator and various quantities of N-methyldiethanolamine (NMDEA) are added to 100 parts of a photo-crosslinkable mixture prepared as described in Example 6. The compositions obtained are applied to a glass plate to a thickness of 50 microns and the films are irradiated at different conveying speeds under an 80 W/cm UV lamp. The sward hardness is then measured in the manner stated in Example 6. The results are given in Table 9.

TABLE 9

| Photoinitiator | NMDEA (parts) | Sward Hardness 20 | 10 | 5 (m/min) |
|---|---|---|---|---|
| Example 2a | 3 | 18 | 35 | 39 |
|  | — | 22 | 28 | 34 |
| Example 4a | 3 | 20 | 36 | 38 |
|  | — | 18 | 28 | 34 |
| Example 4r | 3 | 18 | 24 | 22 |
| Example 4v | 3 | 16 | 26 | 28 |
|  | — | 18 | 24 | 26 |
| Example 4t | 3 | 22 | 32 | 37 |
|  | — | 16 | 18 | 20 |

This table evaluates the passage speed and thus the quantity of radiation necessary to cause polymerisation to the required hardness in a film.

Example 11

3 parts of photoinitiator and possibly 1.5 parts of p-toluenesulphonic acid (PTS) are added to a mixture polymerisable by UV radiation and containing an acid catalysis crosslinking agent consisting of 50 parts of resin obtained by reacting bisphenol-A-bisglycidyl ether with acrylic acid, 20 parts of triethyleneglycol diacrylate and 30 parts of hexamethoxymethylmelamine. The composition is applied to a glass plate to a thickness of 125 microns and the film obtained is irradiated at a speed of 5 m/min under an 80 W/cm UV lamp. The Sward hardness is measured at 20° C. 15 minutes after irradiation ($H_{20}$) and after 20 minutes of heating in an oven temperature-controlled at 110° C. ($H_{110}$), after conditioning at 20° C. The results are given in Table 10.

TABLE 10

| Photoinitiator | PTS | Sward Hardness $H_{20}$ | $H_{110}$ | Film appearance |
|---|---|---|---|---|
| — | — | liquid |  | homogeneous |
| — | + | tacky | slightly tacky | irregular |
| 1-benzoylcyclo-hexanol (1) | — | 24 | 36 | numerous fissures |
| 1-benzoylcyclo-hexanol (1) | + | 16 | 42 | numerous blisters/fissures |
| Example 4a | — | 14 | 42 | homogeneous |
| Example 4v | — | 14 | 50 | homogeneous |

(1): photoinitiator of the known art used for comparison.

Example 12

A white ink consisting of 39 parts of Actilane ® 23 (acrylated aliphatic polyurethane resin of Societe Nationale Des Poudres et Explosifs, Paris), 23 parts of N-vinylpyrrolidone and 38 parts of rutile titanium dioxide is prepared by grinding in a three-cylinder grinder to a particle size of less than 5 microns. Various quantities of a mixture consisting of 1 part of photoinitiator (20% solution in N-methylpyrrolidone), 0.1 parts of 2-isopropylthioxanthone (20% solution in toluene) and 1 part of N-methyldiethanolamine are added to the paste obtained.

The compositions are applied to a glass plate to a thickness of 25 microns, and the films obtained are irradiated under a 40 W/cm UV lamp at the maximum conveying speed necessary to obtain tack-free surfaces. The Sward hardness, pencil scratching hardness (ASTM-3363), resistance to rubbing with methylethylketone (number of rubs before film removal), yellowing index and darkness stability at 60° C. are measured.

The resistance to rubbing with methylethylketone is evaluated in the following manner: the crosslinked film is rubbed with a soft cloth (5 cm$^2$) impregnated with methylethylketone by making a reciprocating movement along a 10 cm path under a pressure imposed by a 2 kg weight. The number of cycles required to observe film removal (the first cycle during which removal commences) is noted. The results of the various measurements are given in Table 11.

TABLE 11

| Photoiniziator | Quantity (based on photoinitiator) | Max. speed (m/min) | Sward Hardness | Pencil Hardness | Resist. to MEK | YI | Stability at 60° C. (days) |
|---|---|---|---|---|---|---|---|
| 4-methylthiobenzophenone | 4 | 18 | 12 | HB | | −1 | 14 |
| | 2 | 18 | 20 | HB | | | |
| | 1 | 18 | 26 | 2H | 30 | | |
| | 0.33 | 10 | 18 | F | | | |
| Example 4r | 4 | 18 | 20 | HB | | −2 | 14 |
| | 2 | 18 | 26 | HB | | | |
| | 1 | 18 | 30 | H | 48 | | |
| | 0.33 | 15 | 22 | F | | | |
| Example 4s | 4 | 18 | 18 | HB | | −2 | 14 |
| | 2 | 18 | 20 | HB | | | |
| | 1 | 18 | 20 | 2H | 30 | | |
| Example 4t | 4 | 18 | 24 | HB | | −2 | 14 |
| | 2 | 18 | 26 | HB | | | |
| | 1 | 18 | 26 | H | 33 | | |
| | 0.33 | 10 | 20 | H | | | |

(1): comparison photoinitiator

Example 13

A non-pigmented liquid composition constituted by resins crosslinkable by acid catalysis, and in particular consisting of 60 parts Luprenal® LR8491 (BASF carboxylated acrylic resin containing 60% of solids)
20 parts Cymel® 301 (American Cyanamid hexamethoxymethylmelamine, 100% solids)
2 parts polydimethylsiloxane copolymerised with propylene oxide (2% solution in xylol)
8 parts n-butanol
10 parts ethylglycol acetate
2 parts catalyst (having a total solids content of about 58%) is applied to a 0.5 mm white sheet of tin free steel by manual filmograph to a thickness of 50 microns. After leaving for 10 minutes the test pieces are irradiated by undergoing various passages at a speed of 5 m/min under a medium-pressure mercury vapour lamp of 80 W/cm at a distance of 11 cm.

The test pieces are heated in an oven to 110° C. for 20 minutes. After conditioning at 20° C. for 2 hours, the Sward hardness is measured (in accordance with ASTM D-2134-66) and the degree of yellowing is estimated (ASTM D-1925-63/T). The stability of the liquid compositions under storage in darkness at 60° C. is given as the percentage increase in viscosity after 10 days at 60° C. over that measured at the moment of preparation. The experimental results are given in Table 12.

TABLE 12

| Catalyst | Number of passages | Sward Hardness | YI | Stability 60° C. + Viscosity (%) |
|---|---|---|---|---|
| p-toluenesulphonic acid (1) | 0 | 60 | 3.0 | gels |
| Example 4a | 0 | 22 | 2.0 | 3 |
| | 1 | 42 | 2.5 | |
| | 3 | 58 | 3.0 | |
| Example 4t | 0 | 20 | 2.5 | 5 |
| | 1 | 38 | 3.0 | |
| | 3 | 56 | 3.5 | |
| Example 4v | 0 | 22 | 2.0 | 2 |
| | 1 | 44 | 2.5 | |
| | 3 | 60 | 3.0 | |
| Example 4y | 0 | 24 | 2.0 | 3 |
| | 1 | 42 | 2.5 | |
| | 3 | 56 | 3.0 | |
| Example 4w | 0 | 22 | 2.0 | 2 |
| | 1 | 46 | 2.9 | |
| | 3 | 60 | 3.0 | |

(1) Catalyst of the known art, used for comparison

Example 14

100 parts of each of various photopolymerisable, non-pigmented liquid compositions formed from an aqueous solution of acrylic acid either totally or partly neutralised with sodium hydroxide and either containing or not containing N-methyldiethanolamine (as shown in Table 13) are fed with 5 parts of the following compounds separately:

A—sodium thiosulphate pentahydrate
B—(4-benzoylbenzyl)trimethylammonium chloride
C—S-benzylthiosulphate
D—Example 1i
E—Example 5a as aqueous solutions containing 40% of active substance, with the exception of E which is used as obtained in Example 5a.

A and C are compounds used for reference.

B is a photoinitiator of the known art, used for reference.

The compositions thus obtained are deposited on a metal plate to a thickness of 1 mm and irradiated at a distance of 25 cm by 500 W mercury vapour lamp of Ultravitalux® (Osram) type. The behaviour of the liquid compositions is observed after various exposure times and after 24 hours from the end of irradiation. The results are given in Table 13.

TABLE 13

| Character | POLYMERISABLE SYSTEM Composition | (parts by weight) | Photoinitiator | After irradiating for 30 | 120 | 300 sec. | FILM CHARACTERISTICS After conditioning 4 h at 20° C. | Colour |
|---|---|---|---|---|---|---|---|---|
| Neutral | Acrylic acid | 26.62 | A | L | L | L | — | — |
|  | NaOH | 14.80 | B | L | L | G | P | I |
|  | Water | 58.55 | C | L | L | L | — | — |
|  |  |  | D | V | R | U/P | F | Y |
|  |  |  | E | V/R | U | U/P | F | I |
| Neutral | Acrylic acid | 27.24 | A | L | L | L | — | — |
|  | NaOH | 14.24 | B | R/U | U | P | F | Y |
|  | Water | 56.37 | C | L | L | L | — | — |
|  | NMDEA | 2.14 | D | G | R/U | P | F | Y |
|  |  |  | E | R/U | U | P | F | I |
| Alkaline | Acrylic acid | 28.65 | A | L | L | L | — | — |
|  | NaOH | 15.91 | A | R/U | U | P | F | Y |
|  | Water | 53.05 | C | L | L | L | — | — |
|  | NMDEA | 2.39 | D | — | — | — | — | — |
|  |  |  | E | R/U | U | P | F | I |
| Acid | Acrylic acid | 34.95 | A | L | L | L | — | — |
|  | NaOH | 9.71 | B | L | L | L | — | — |
|  | Water | 52.43 | C | L | L | L | — | — |
|  | NMDEA | 2.91 | D | V | U | U/P | F | I |
|  |  |  | E | V/G | U | U/P | F | I |

L = liquid; V = viscous liquid; G = gel; R = tacky film; U = resistant film with moist surface; P = resistant film with tacky surface; F = resistant film with dry surface; I = colourless; Y = slight yellow coloration.

We claim:

1. A photopolymerizable mixture comprising:
   (a) a photopolymerizable composition including at least one of esters formed from acrylic or methacrylic acid and aliphatic alcohols, glycols, polyhydroxylated compounds or amino alcohols; acrylonitrile; acrylamide or substituted acrylamides; esters formed from vinyl alcohol and aliphatic acids or acrylic acid; vinyl ethers; N-vinylpyrrolidone; mono-or poly-functional allyl ethers; styrene; alpha-methylstyrene; polyesters; polyacrylates; polyurethanes; epoxides; acrylic, fumaric or maleic modified polyethers; or unsaturated polyesters in combination with styrene; or
   (b) a polycondensable composition including at least one aminoplast and ethers thereof prepared from at least one methyolated member selected from the group consisting of melamine, urea, glycourea and benzoguanamine in combination with at least one resin selected from the group consisting of acrylic, polyester, alkyd, phenolic and polyvinyl resins having hydroxyl, carboxyl, amido, amino, or thiol groups to provide mobile hydrogens; or
   (c) a photopolymerizable composition as defined in (a) and a polycondensable composition as defined in (b); and
   (d) at least one photoinitiator of the formula:

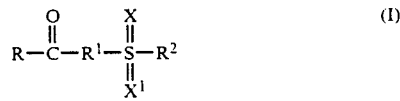

(I)

in which
   R signifies $C_6$–$C_{14}$ aryl, $C_6$–$C_{14}$ thioaryl, or polyaryl;
   $R^1$ signifies $C_1$–$C_6$ alkylene, $C_2$–$C_{18}$ alkylidene, $C_3$–$C_7$ cycloalkylidene, or $C_2$–$C_{10}$ alkenylene;
   $R^2$ signifies linear or branched $C_1$–$C_{18}$ alkyl, $C_3$–$C_7$ cycloalkyl, $C_6$–$C_{14}$ aryl, polyaryl; and
   X and $X^1$, are each oxygen independently represent an electronic doublet or O.

2. A photopolymerizable mixture in accordance with claim 1, in which at least one photoinitiator is a compound selected from the group consisting of 2-(4-methylphenylsulfonyl)-2-methyl-propiophenone, 2-(4-chlorophenyl-sulfonyl)-2-methyl-propiophenone, 2-methylsulfonyl-2-methyl-propiophenone, 2-phenylsulfonyl-2-methyl-1-(4-methylthiophenyl)-1-propanone, 2-(4-methylphenyl-sulfonyl)-2-methyl-1-(4-methylthiophenyl)-1-propanone and 2-phenysulphonyl-2-methyl-propiophenone.

3. A photopolymerizable mixture in accordance with claim 1, wherein the photoinitiator is 2-phenysulphonyl-2-methyl-propiophenone.

4. A photopolymerizable mixture in accordance with claim 1, in which
   R signifies $C_6$–$C_{14}$ aryl;
   $R^1$ signifies $C_1$–$C_6$ alkylene, $C_2$–$C_{18}$ alkylidene, or $C_3$–$C_7$ cycloalkylidene;
   $R^2$ signifies linear or branched $C_1$–$C_{18}$ alkyl, $C_3$–$C_7$ cycloalkyl, $C_6$–$C_{14}$ aryl.

5. A photopolymerizable mixture according to claim 1, wherein the compound of formula (I) is present in a quantity between 0.01 and 15% by weight.

6. A photopolymerizable mixture in accordance with claim 5, wherein the compound of formula (I) is present in a quantity between 0.5 and 5% by weight.

7. A photopolymerizable mixture in accordance with claim 1, wherein the photopolymerizable composition is an acrylate or methacrylate dissolved in water.

8. A photopolymerizable mixture according to claim 1, containing an aliphatic tertiary amine or esters of p-dimethylaminobenzoic acid or 4,4'-bis-dimethylaminobenzophenone or p-dimethylaminobenzaldehyde.

9. A photopolymerizable mixture according to claim 1, containing at least one pigment.

10. A photopolymerizable mixture in accordance with claim 9, wherein the pigment is titanium dioxide.

11. A photopolymerizable mixture in accordance with claim 10, containing a thioxanthone derivatives as a spectral sensitizer.

12. A process for polymerizing a photopolymerizable mixture as claimed in claim 1, by irradiating with UV light of between 250 and 450 nm wavelength.

* * * * *